US009899384B2

(12) United States Patent
Cheng et al.

(10) Patent No.: US 9,899,384 B2
(45) Date of Patent: Feb. 20, 2018

(54) SELF ALIGNED STRUCTURE AND METHOD FOR HIGH-K METAL GATE WORK FUNCTION TUNING

(71) Applicant: INTERNATIONAL BUSINESS MACHINES CORPORATION, Armonk, NY (US)

(72) Inventors: Kangguo Cheng, Schenectady, NY (US); Bruce B. Doris, Slingerlands, NY (US); Ali Khakifirooz, Los Altos, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/204,228

(22) Filed: Jul. 7, 2016

(65) Prior Publication Data

US 2016/0315083 A1  Oct. 27, 2016

Related U.S. Application Data

(62) Division of application No. 14/607,436, filed on Jan. 28, 2015, now Pat. No. 9,401,311.

(Continued)

(51) Int. Cl.
*H01L 21/70* (2006.01)
*H01L 27/092* (2006.01)
(Continued)

(52) U.S. Cl.
CPC ...... *H01L 27/092* (2013.01); *H01L 21/02068* (2013.01); *H01L 21/02532* (2013.01);
(Continued)

(58) Field of Classification Search
None
See application file for complete search history.

(56) References Cited

U.S. PATENT DOCUMENTS 7,838,908 B2 * 11/2010 Kwon ............. H01L 21/823807
257/204
8,350,332 B2 * 1/2013 Oosuka ............. H01L 21/82345
257/368
(Continued)

OTHER PUBLICATIONS

Cheng, Kangguo et al. "Self Aligned Structure and Method for High-K Metal Gate Work Function Tuning" U.S. Appl. No. 14/607,436, filed Jan. 28, 2015.
(Continued)

*Primary Examiner* — Shaun Campbell
(74) *Attorney, Agent, or Firm* — Cantor Colburn LLP; Vazken Alexanian (57) ABSTRACT

A semiconductor device and a method for fabricating the device. The method includes: forming a STI in a substrate having a nFET and a pFET region; depositing a high-k layer and a TiN layer; depositing a polycrystalline silicon layer; forming a block level litho layer; removing a portion of the polycrystalline silicon layer; removing the block level litho layer; forming a first protective layer; depositing a fill layer above the pFET region; removing the first protective layer; cutting the TiN layer and the high-k layer to expose a portion of the STI; depositing a second protective layer on the STI; removing the fill layer; removing the TiN layer above the pFET region; treating the high-k layer with a work function tuning process; removing the polycrystalline silicon layer and TiN layer; and depositing a metal layer on the high-k layer and the second protective layer.

14 Claims, 7 Drawing Sheets

Related U.S. Application Data (60) Provisional application No. 61/987,762, filed on May 2, 2014.

(51) Int. Cl.
| | | |
|---|---|---|
| H01L 21/8238 | (2006.01) | |
| H01L 21/762 | (2006.01) | |
| H01L 29/66 | (2006.01) | |
| H01L 21/02 | (2006.01) | |
| H01L 21/28 | (2006.01) | |
| H01L 29/49 | (2006.01) | |
| H01L 29/51 | (2006.01) | |
| H01L 21/8234 | (2006.01) | |
| H01L 23/29 | (2006.01) | |
| H01L 23/31 | (2006.01) | |
| H01L 29/06 | (2006.01) | |

(52) U.S. Cl.
CPC ........ *H01L 21/28* (2013.01); *H01L 21/28088* (2013.01); *H01L 21/28185* (2013.01); *H01L 21/28194* (2013.01); *H01L 21/762* (2013.01); *H01L 21/76224* (2013.01); *H01L 21/823481* (2013.01); *H01L 21/823828* (2013.01); *H01L 21/823842* (2013.01); *H01L 21/823857* (2013.01); *H01L 21/823878* (2013.01); *H01L 23/291* (2013.01); *H01L 23/3171* (2013.01); *H01L 27/0922* (2013.01); *H01L 29/0649* (2013.01); *H01L 29/4966* (2013.01); *H01L 29/517* (2013.01); *H01L 29/518* (2013.01); *H01L 29/66* (2013.01); *H01L 29/66545* (2013.01)

(56) References Cited

U.S. PATENT DOCUMENTS

| | | | | |
|---|---|---|---|---|
| 2007/0001238 A1* | 1/2007 | Koyama | ......... | H01L 21/823842 257/407 |
| 2007/0152276 A1* | 7/2007 | Arnold | ........... | H01L 21/823857 257/369 |
| 2009/0108366 A1* | 4/2009 | Chen | ................. | H01L 21/28079 257/369 |
| 2010/0178772 A1* | 7/2010 | Lin | .................... | H01L 21/28088 438/703 |
| 2010/0317181 A1* | 12/2010 | Chung | ............ | H01L 21/823821 438/585 |
| 2012/0156846 A1* | 6/2012 | Thees | ............... | H01L 21/76232 438/285 |
| 2014/0187028 A1* | 7/2014 | Ando | ............. | H01L 21/823857 438/585 |

OTHER PUBLICATIONS

List of IBM Patents or Patent Applications Treated as Relatated; Mar. 27, 2017; pp. 1-2.

\* cited by examiner

SELF ALIGNED STRUCTURE AND METHOD FOR HIGH-K METAL GATE WORK FUNCTION TUNING

DOMESTIC PRIORITY

This application is a divisional application of application Ser. No. 14/607,436 filed Jan. 28, 2015, which claims priority to U.S. Provisional Application No. 61/987,762, entitled "SELF ALIGNED STRUCTURE AND METHOD FOR HIGH K METAL GATE WORK FUNCTION TUNING," filed May 2, 2014, which are incorporated herein by reference in their entirety.

BACKGROUND

The present invention relates to the field of semiconductor devices. More specifically, the present invention relates to tunable work function for RMG integration.

High-k metal gate technology has changed the way a silicon (Si) transistor is built. It is one of the most significant innovations in the last few decades, enabling the continued scaling of microprocessors and providing significant power and performance benefits. In high-k metal gate technology, the silicon oxide insulator and poly-silicon electrode from the transistor are replaced by a high dielectric constant (k) insulator and metal electrode. The development of high-k and metal gates has led to improved performance of key features, including: work function control, thermal stability, high mobilities, reduced nanoscale variability, enhanced AC performance, and dielectric reliability.

There are several challenges that exist as semiconductor devices are scaled down, one of which involves choosing the materials to use for the gate dielectric and electrode. Selecting which gate to use usually involves factoring in resistivity and work function. Currently, the replacement metal gate (RMG) approach is becoming the industry standard. RMG technology has a number of advantages over gate-first integration, which allows for improved device performance and provides the fabricator with additional options to select from for the gate metal and high-k materials. Several other advantages of RMG are improved short channel control, improved work function tuning, and lower gate resistance.

SUMMARY

According to a first aspect of the present invention, a method for fabricating a semiconductor device is provided. The method includes: forming a shallow trench isolation in a semiconductor substrate, wherein the shallow trench isolation has a first, second, and third portion, and the semiconductor substrate has a nFET region and a pFET region; depositing a high-k dielectric layer on the semiconductor substrate and shallow trench isolation; depositing a TiN layer on the high-k dielectric layer; depositing a polycrystalline silicon layer on the TiN layer; forming a block level litho layer on the polycrystalline silicon layer, wherein the block level litho layer is formed above the nFET region; removing the polycrystalline silicon layer above the pFET region, wherein the polycrystalline silicon layer above the nFET region has a sidewall; removing the block level litho layer; forming a first protective layer on the sidewall of the polycrystalline silicon layer above the nFET region, wherein the protective layer is formed above the second portion of the shallow trench isolation; depositing a fill layer on the TiN layer above the pFET region; removing the first protective layer; cutting the TiN layer and the high-k dielectric layer so that the second portion of the shallow trench isolation is exposed; depositing a second protective layer on the second portion of the shallow trench isolation; removing the fill layer; removing the TiN layer above the pFET region; treating the high-k dielectric layer above the pFET region with a work function tuning process; removing the polycrystalline silicon layer and the TiN layer above the nFET region; and depositing a metal layer on the high-k dielectric layer and the second protective layer.

According to another aspect of the present invention, a semiconductor device is provided. The device includes: a semiconductor substrate, a shallow trench isolation is formed in the semiconductor substrate and has a first, second, and third portion, the semiconductor substrate includes a nFET region and a pFET region; a protective layer disposed on the second portion of the shallow trench isolation; a high-k dielectric layer disposed on the semiconductor substrate, the high-k dielectric layer is disposed on the nFET and pFET regions of the semiconductor substrate and disposed on the first and third portions of the shallow trench isolation; a metal layer disposed on the high-k dielectric layer and the protective layer; and wherein the high-k dielectric layer disposed above the pFET region and the third portion of the shallow trench isolation is treated with a work function tuning process.

BRIEF DESCRIPTION OF THE DRAWINGS

Features, advantages, and other aspects of various embodiments of the present invention will become more apparent from the following detailed description, when taken in conjunction with the figures to illustrate several embodiments of the present invention in an exemplary rather than limiting manner.

DETAILED DESCRIPTION

According to an embodiment of the present invention, a semiconductor device and a method for fabricating the device are provided. The method includes: cutting the high-k layer between nFET and pFET region of a semiconductor device; forming a sealing spacer in the location of the cut to prevent oxygen diffusion into nFET region; and treating the pFET region with oxygen to reduce the pFET voltage without affecting nFET region.

Figure 11:
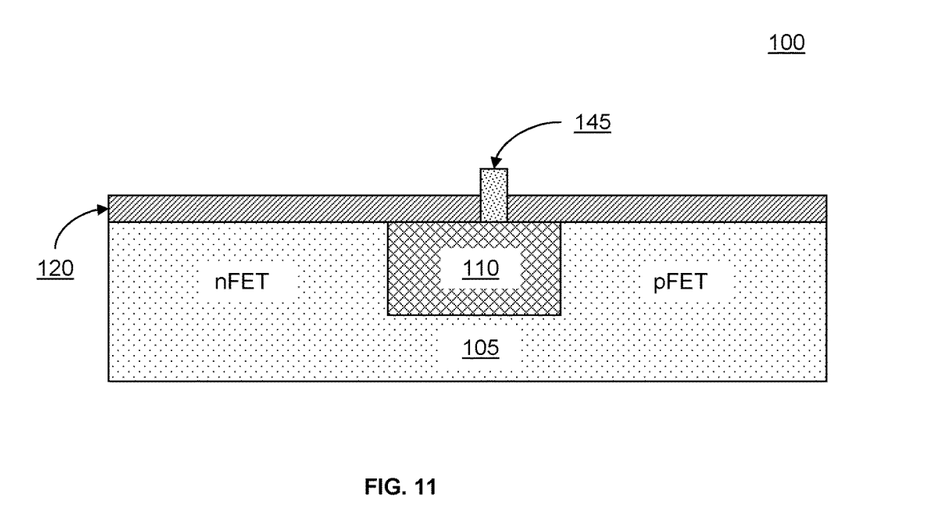
FIG. 11 is a cross-sectional view of a semiconductor device, according to an embodiment of the present invention, following the removal of the polycrystalline silicon layer and the TiN layer covering the nFET region.
Figure 12:
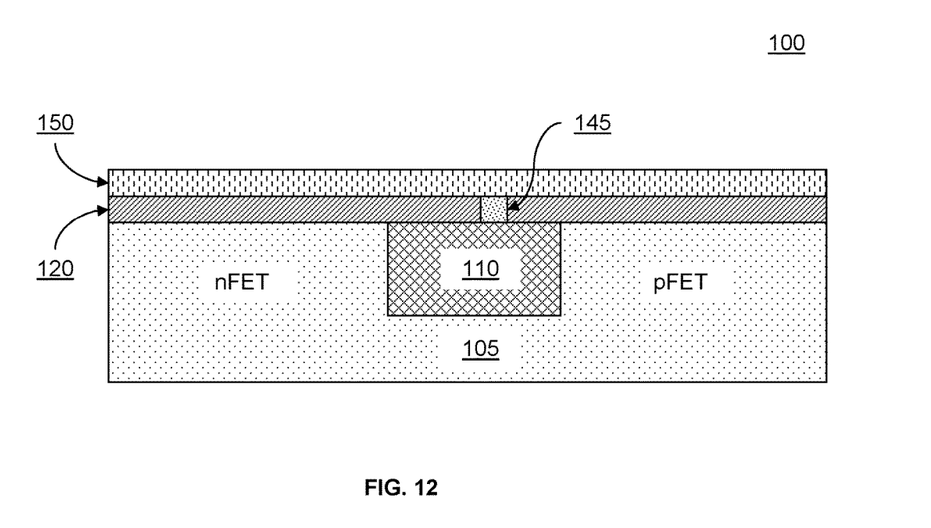
FIG. 12 is a cross-sectional view of a semiconductor device, according to an embodiment of the present invention, after a metal and gate material are deposited and patterned.
Figure 13:
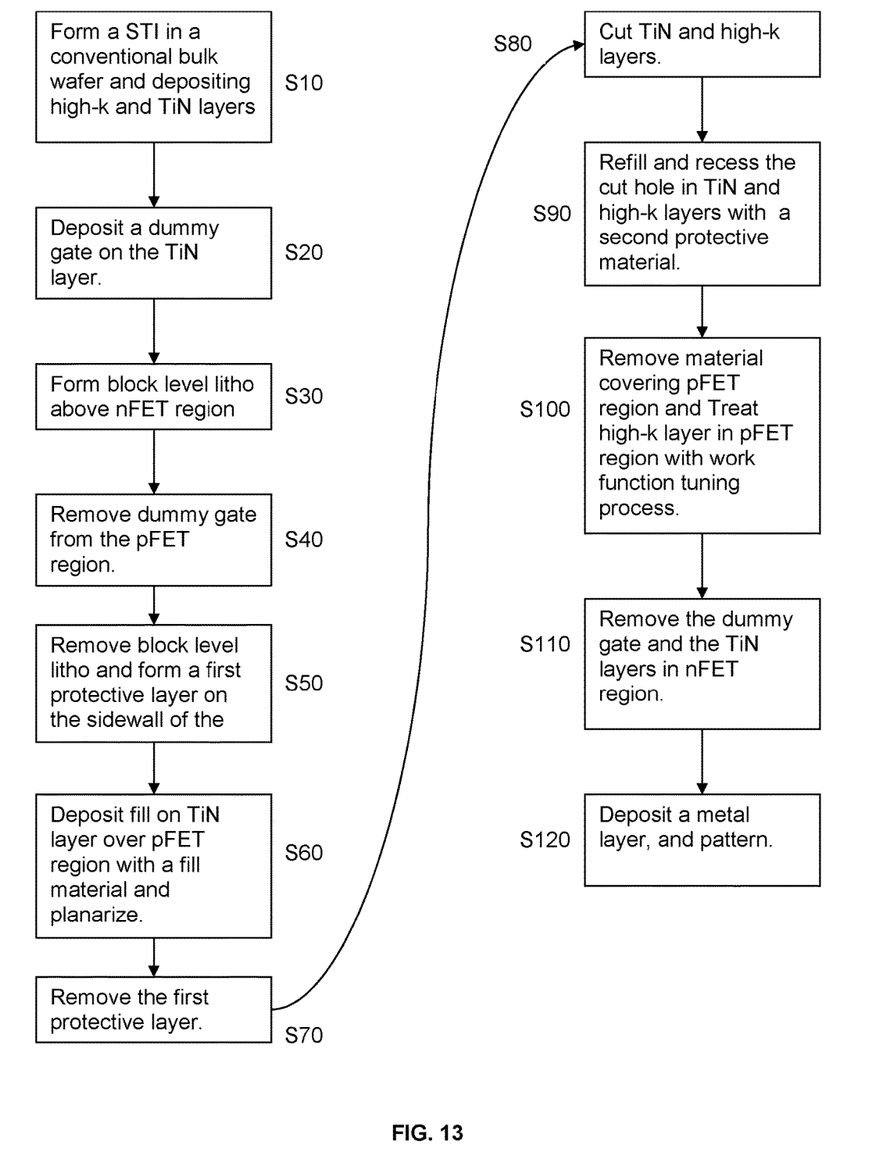
FIG. 13 is a flowchart depicting a method for fabricating a semiconductor device, according to an embodiment of the present invention.

According to an embodiment of the present invention, FIGS. 1 through 12 depict cross-sectional views of a semiconductor device after steps of a method for fabricating the device, as depicted in FIG. 13, are performed. However, the present invention can be implemented in various manners, and thus should not be construed to be limited to the embodiments disclosed herein.

In order for successful RMG fabrication there is a need for a structure that prevents oxygen diffusion from the pFET region to the nFET region. This structure can be fabricated by cutting the high-k layer between the nFET and pFET regions, forming a sealing spacer in the location of the cut, and treating the pFET region with oxygen. When the pFET region is treated with oxygen, the pFET voltage is reduced. The sealing spacer prevents oxygen diffusion from the pFET to the nFET region. Thus, the voltage in the nFET region is not affected.

Figure 1:
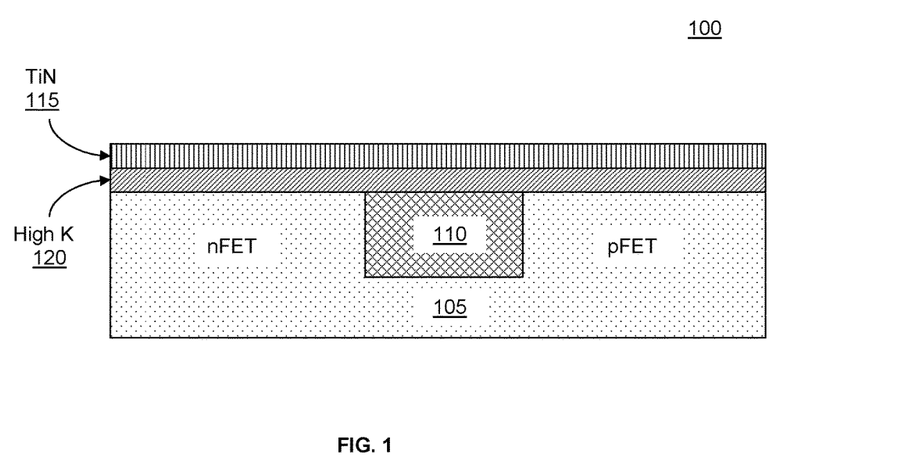
FIG. 1 is a cross-sectional view of a semiconductor device, according to an embodiment of the present invention, following deposition of high-k and TiN layers.

Referring to FIG. 1, semiconductor device 100 is depicted following the completion of step S10. Semiconductor device 100 includes semiconductor substrate 105, shallow trench isolation (STI) 110 formed in semiconductor substrate 105. Semiconductor substrate 105 includes a negative channel field-effect transistor (nFET) region and a positive channel field-effect transistor (pFET) region. STI 110 can be formed of a low k dielectric material such as silicon nitride, silicon oxide, or other low k dielectric materials known in the art. STI 110 is formed in semiconductor substrate 105 beneath the gate and is used to separate the source/drain regions and control voltage. Forming STI 110 creates isolation between active transistors and prevents electrical current leakage between adjacent semiconductor components. STI 110 and semiconductor substrate 105 form a smooth horizontal edge on the top of both components.

Semiconductor device 100 further includes a high-k dielectric layer 120, which can be formed by atomic layer deposition or similar industry processes. High-k dielectric layer 120 is deposited on semiconductor substrate 105 and STI 110. The bottom side of high-k dielectric layer 120 contacts the top side smooth horizontal edge created between STI 110 and semiconductor substrate 105. High-k dielectric layer 120 can be 0.5 to 4 nm thick, with a preferable thickness of 1.8 nm. High-k dielectric layer 120 can include a dielectric metal oxide. High-k dielectric layer 120 can further include the following materials: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, or any other commonly known material with a high-k dielectric level in the industry.

Semiconductor device 100 further includes a titanium nitride (TiN) layer 115, which can be formed by Atomic Layer Deposition (ALD), Metal Organic Chemical Vapor Deposition (MOCVD), or similar industry processes. The bottom side of TiN layer 115 contacts the top side of high-k dielectric layer 120. TiN layer 115 can be ~0.5 to 5 nm thick, with a preferably thickness of 1.5 nm.

Figure 2:
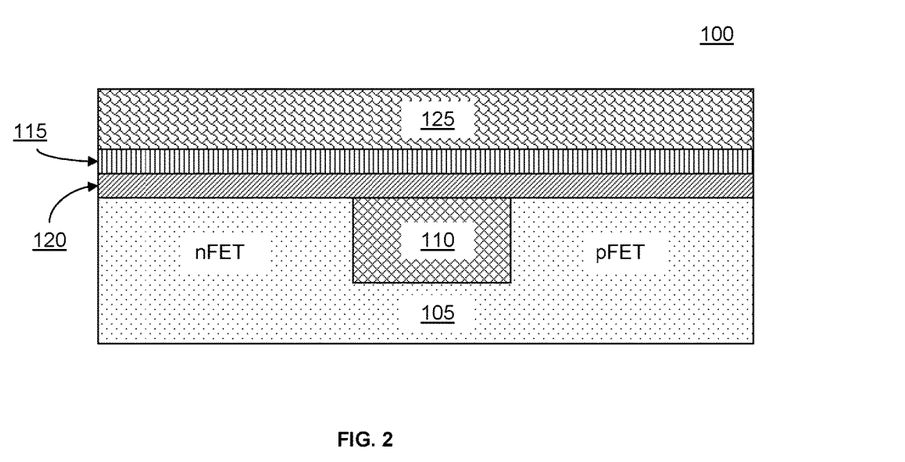
FIG. 2 is a cross-sectional view of a semiconductor device, according to an embodiment of the present invention, following deposition of a polycrystalline silicon layer.

Referring to FIG. 2, semiconductor device 100 is illustrated following the completion of step S20. Polycrystalline silicon layer 125 is deposited on TiN layer 115. Polycrystalline silicon layer 125 can be formed by Rapid Thermal Chemical Vapor Deposition (RTCVD), Low Pressure Chemical Vapor Deposition (LPCVD), or similar industry process. The bottom side of polycrystalline silicon layer 125 contacts the top side of TiN layer 115. Polycrystalline silicon layer 125 can be ~1 nm to 10 nm thick, with a preferable thickness of 5 nm.

Figure 3:
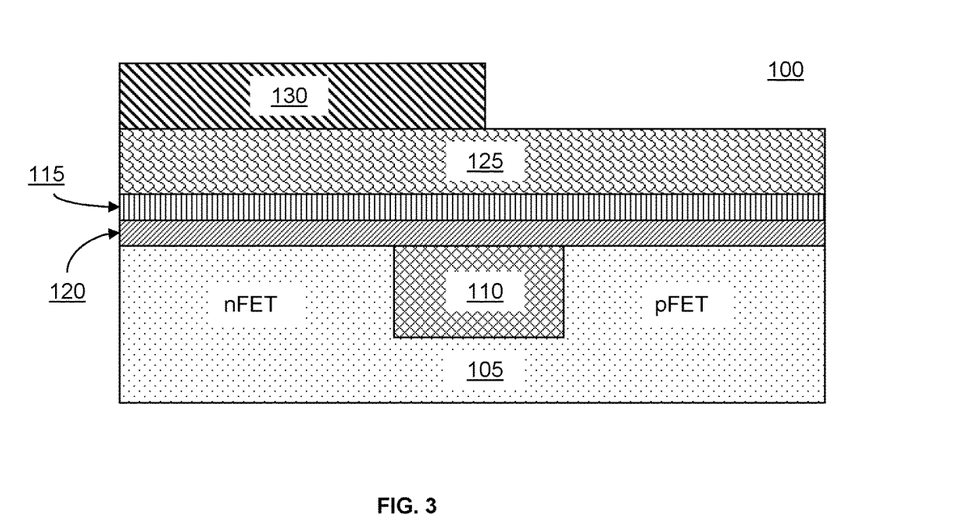
FIG. 3 is a cross-sectional view of a semiconductor device, according to an embodiment of the present invention, after a block level litho is formed.

Referring to FIG. 3, semiconductor device 100 is shown following the completion of step S30. Semiconductor device 100 includes a block level litho layer 130, which is formed on polycrystalline silicon layer 125 above the nFET region of semiconductor substrate 105. Block level litho layer 130 can be formed using standard lithography processes that utilizes photo resist and an exposure process to pattern the resist into regions that block one FET and leave another open, or other similar standard industry processes. The bottom side of block level litho layer 130 contacts the top side of polycrystalline silicon layer 125 that is located above the nFET region of semiconductor substrate 105 and a portion of STI 110. Block level litho layer 130 can be 100 nm thick. Block level litho layer 130 is formed through photolithography, which patterns bulk on the substrate of a semiconductor device. The photolithography process includes of the steps of, first cleaning any contaminations that are present on the substrate, then removing any leftover moisture from the substrate by annealing it to a predefined temperature, then covering the substrate to the desired thickness with photoresist, and finally patterning the layer of photoresist with light and baking the bulk.

Figure 4:
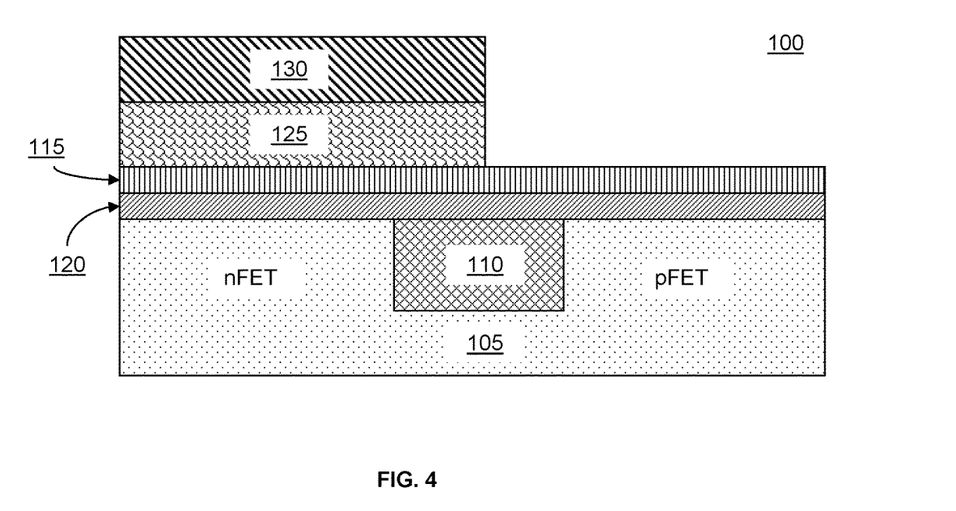
FIG. 4 is a cross-sectional view of a semiconductor device, according to an embodiment of the present invention, after the polycrystalline silicon layer is removed from the pFET region.

Referring now to FIG. 4, semiconductor device 100 is depicted after step S40 is performed. In step S40, polycrystalline silicon layer 125 is removed from the pFET region of semiconductor substrate 105. Polycrystalline silicon layer 125 can be removed by a HBr dry reactive ion etch process. Removal of polycrystalline silicon layer 125 leaves TiN layer 115 as the top layer over the pFET region of semiconductor substrate 105. Block level litho layer 130 remains the top layer on the nFET region of semiconductor substrate 105.

Figure 5:
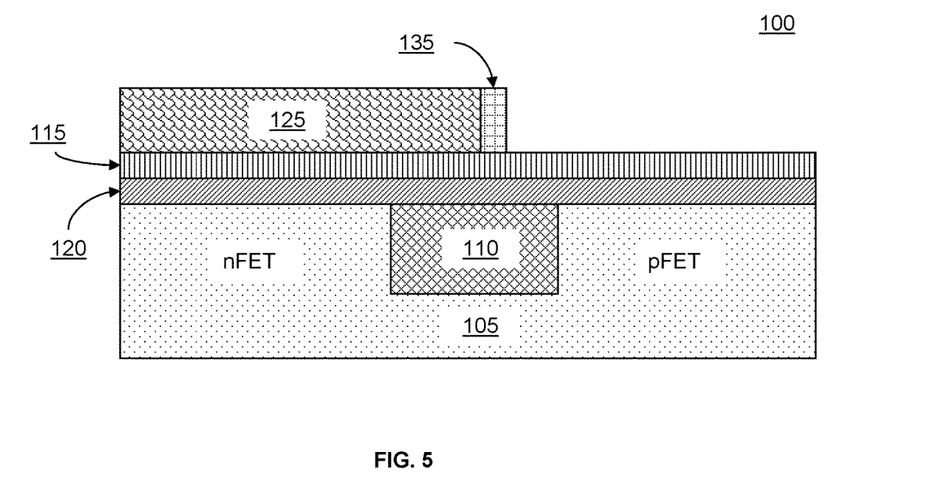
FIG. 5 is a cross-sectional view of a semiconductor device, according to an embodiment of the present invention, following the removal of the block level litho layer and the formation of a protective layer on the sidewall of the polycrystalline silicon layer.

Referring to FIG. 5, semiconductor device 100 is illustrated following the completion of step S50. In step S50, block level litho layer 130 is removed, leaving polycrystalline layer 125 as the top layer on the nFET region of semiconductor substrate 105. The pFET region remains unchanged with TiN layer 115 as the top layer. Block level litho layer 130 can be removed using a wet etching process, where liquid chemicals are used to remove material from the surface of the substrate. For example, the RCA clean wet cleaning process can be used. This process includes: an organic cleanse, where any organic contaminants are removed from the substrate; followed by an oxide strip, which removes the thin oxide layer on the substrate; and finally an ionic cleanse, where any remaining ionic contamination is removed from the substrate. Further processes that can be used are the megasonic cleaning process, which cleanses the substrate by generating sonic waves in the cleaning solution to increase the efficiency of particle removal process, or any similar methods known in the industry.

Step S50 further includes forming a protective layer 135 on the sidewall of the remaining portion of polycrystalline layer 125. Protective layer 135 can include silicon nitride and can be deposited by Rapid Thermal Chemical Vapor Deposition (RTCVD) or Low Pressure Chemical Vapor Deposition (LPCVD). The bottom side of protective layer 135 contacts the top side of TiN layer 115 and is centered directly over STI 110. Protective layer 135 forms a vertical contact with polycrystalline layer 125 that is over the nFET region of semiconductor substrate 105, as depicted in FIG. 5. Protective layer 135 can be made of silicon nitride or other materials known in the industry and its thickness is equal to polycrystalline layer 125. Protective layer has a width equal to ~5 nm.

Figure 6:
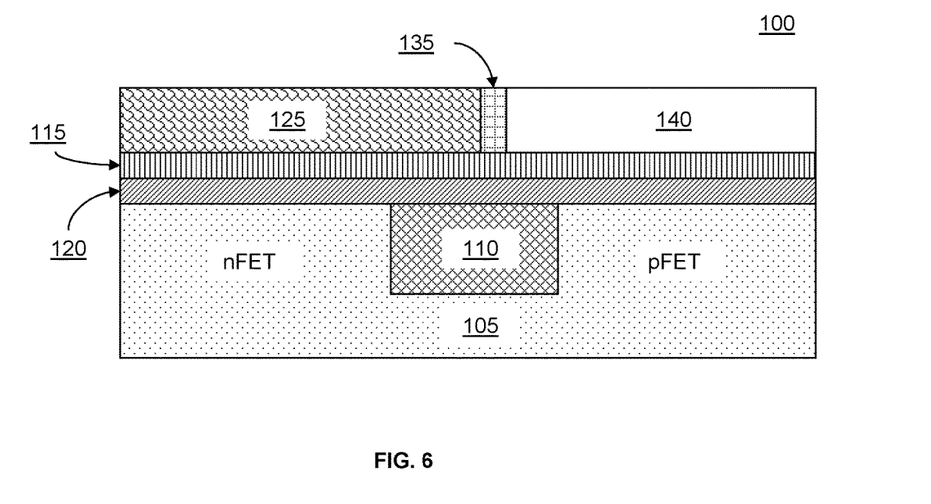
FIG. 6 is a cross-sectional view of a semiconductor device, according to an embodiment of the present invention, after refilling the region over the pFET region with SiGe and planarizing.

Referring to FIG. 6, semiconductor device 100 is shown following step S60. Fill layer 140 is deposited on TiN layer 115 above the pFET region. Fill layer 140 can include silicon-germanium or poly silicon-germanium. Fill layer 140 can be formed by RTCVD, LPCVD, or other similar standard industry process, directly on top TiN layer 115 over the pFET region of semiconductor substrate 105. The bottom side of fill layer 140 contacts the top side of TiN layer 115. Fill layer 140 can have the same thickness as polycrystalline layer 125. After fill layer 140 is formed, the top layer of semiconductor device 100 includes polycrystalline layer 125, protective layer 135, and fill layer 140. After the formation of fill layer 140, fill layer 140 is planarized through a mixture of chemical etching and abrasive polishing.

Figure 7:
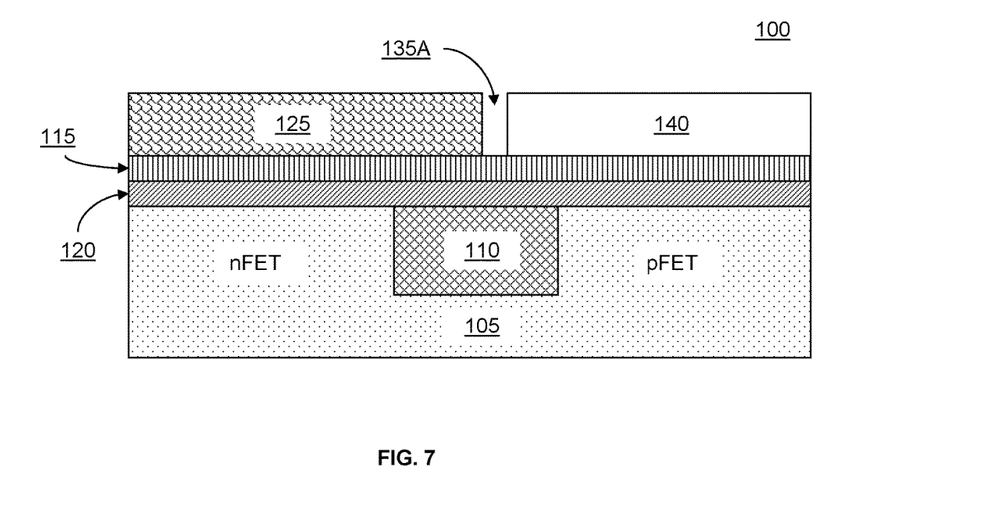
FIG. 7 is a cross-sectional view of a semiconductor device, according to an embodiment of the present invention, following the removal of the protective layer on the sidewall of the polycrystalline silicon layer.

Referring to FIG. 7, semiconductor device 100 is shown after step S70 has been performed. In step S70, protective layer 135, which is located between polycrystalline layer 125 and fill layer 140, is removed. Removal can be accomplished by using a HF diluted by ethylene glycol (HFEG), which is an etching process that utilizes a HFEG solution to etch the nitride and oxide of protective layer 135 simultaneously. Removal of protective layer 135 can also be done using a hot Phos wet etching process. After the etching of protective layer 135 is complete, a gap/void 135A is formed between polycrystalline layer 125 and fill layer 140. Polycrystalline layer 125 and fill layer 140 form the walls of gap/void 135A. The top of TiN layer 115 forms the bottom of gap/void 135A.

Figure 8:
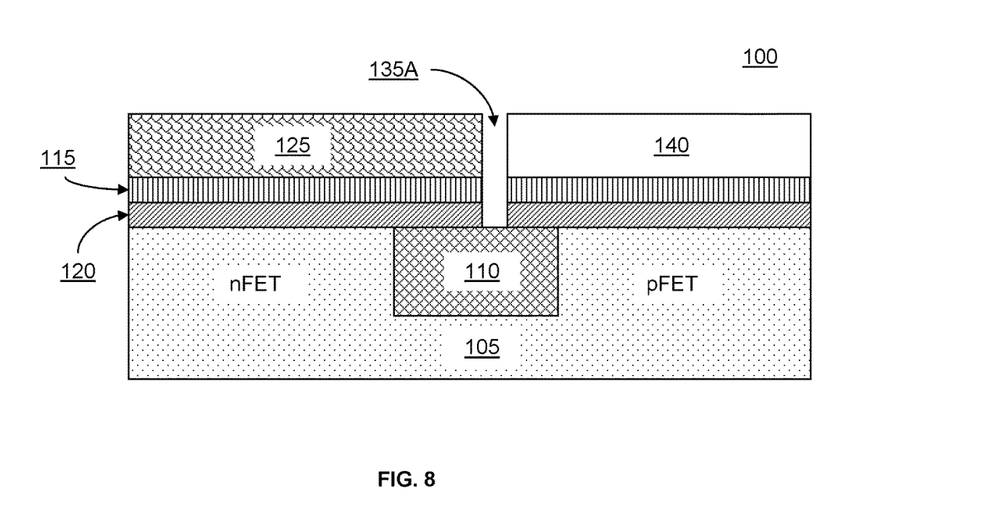
FIG. 8 is a cross-sectional view of a semiconductor device, according to an embodiment of the present invention, after cutting through the TiN and high-k layers.

Referring to FIG. 8, semiconductor device 100 is depicted after the completion of step S80. In step S80, the portion of both TiN layer 115 and high-k dielectric layer 120 immediately below gap/void 135A are removed. Both TiN layer 115 and high-k dielectric layer 120 can be cut using BCl3 reactive ion etching process or using Ar Sputter followed by a wet etch with Hf 100:1. As shown in FIG. 8, gap/void 135A has a first wall, which includes high-k dielectric layer 120, TiN layer 115, and polycrystalline layer 125 on the nFET side of semiconductor substrate 105. A second wall of gap/void 135A includes high-k dielectric layer 120, TiN layer 115, and fill layer 140. STI 110 is exposed as a result of the cut and makes up the bottom of gap/void 135A. Gap/void 135A can have a width of 5 nm.

Figure 9:
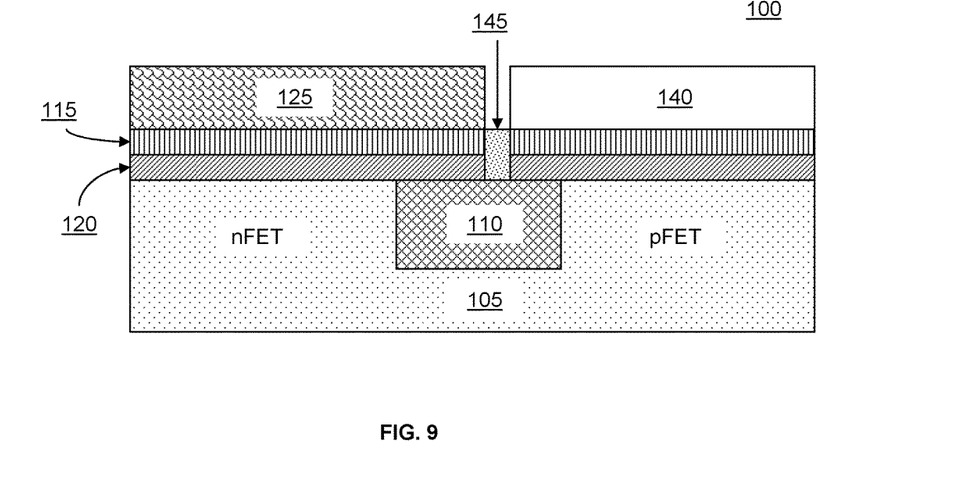
FIG. 9 is a cross-sectional view of a semiconductor device, according to an embodiment of the present invention, after refilling and recessing the region cut through the TiN and high-k layers with a protective material.

Referring to FIG. 9, semiconductor device 100 is shown following the completion of step S90. In step S90, gap/void 135A is filled with a protective gate material 145 and then recessed. Protective gate material 145 can be deposited by Rapid Thermal Chemical Vapor Deposition (RTCVD) or Low Pressure Chemical Vapor Deposition (LPCVD). Protective gate material 145 can be made of silicon nitride or similar industry materials. The underside of protective gate material 145 sits on top of and forms a contact with the top side of STI 110, which is located between the nFET and the pFET regions of semiconductor substrate 105. Protective gate material 145 can have a thickness equal to the combined thickness of TiN layer 115 and high-k dielectric layer 120.

Figure 10:
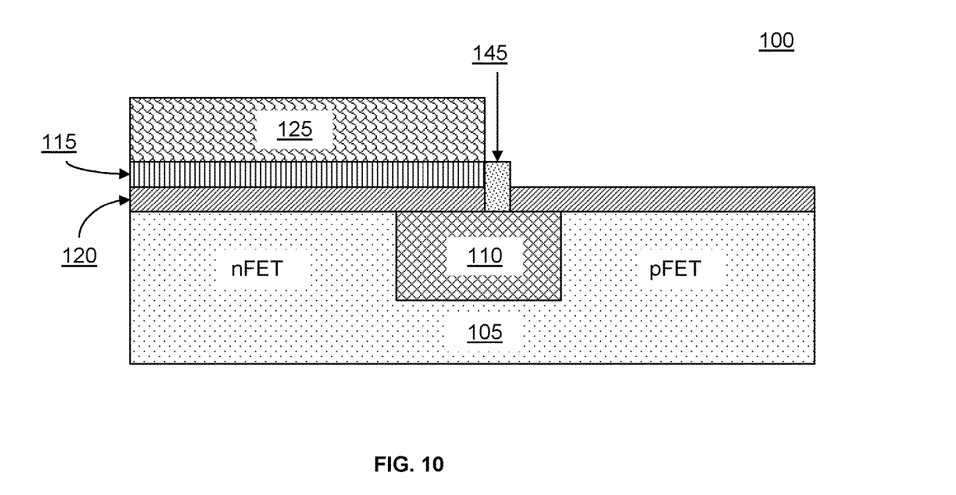
FIG. 10 is a cross-sectional view of a semiconductor device, according to an embodiment of the present invention, following the removal of the SiGe and TiN layers covering the pFET region and the treatment of the high-k layer with a work function tuning process.

Referring to FIG. 10, semiconductor device 100 is illustrated following the completion of step S100. In S100, fill layer 140 and TiN layer 115 above the pFET region of semiconductor substrate 105 are removed. By removing these layers, high-k dielectric layer 120 above the pFET region is exposed. Step S100 further includes treating high-k dielectric layer 120 with a work function tuning process. Fill layer 140 can be removed using a wet etching process, such as the RCA clean wet cleaning process, the megasonic cleaning process, or any similar methods known in the industry. After fill layer 140 is removed, TiN layer 115 above the pFET region of semiconductor substrate 105 is removed. TiN layer 115 can be removed using a similar process as the removal of fill layer 140. Following the removal of TiN layer 115, high-k dielectric layer 120 becomes the top layer above the pFET region of semiconductor substrate 105. Protective gate material gate 145 remains and is not removed. It remains disposed on STI 110. Protective gate material 145 prevents the work function tuning that is performed on the pFET region from affecting the layers in the nFET region of semiconductor substrate 105.

Still referring to FIG. 10, semiconductor device 100 includes high-k dielectric layer 120 on top of the pFET region of semiconductor substrate 105. This allows high-k dielectric layer 120 to be treated with the work function tuning process. The work function is the minimum energy that is needed to remove an electron from the solid top layer of semiconductor device 100. Both the pFET and the nFET regions of the semiconductor substrate 101 have different work function requirements. The work function is obtained by doping the top layer of the semiconductor device, and it forms a critical property of the metal gate, where the voltage and voltage threshold are determined for the device. High-k dielectric layer 120 can be treated with an $O_2$ tuning process or other processes known in the art.

Referring to FIG. 11, semiconductor device 100 is shown following the completion of step S110. In step S110, polycrystalline layer 125 and TiN layer 115 above the nFET region are removed. Polycrystalline layer 125 can be removed using a wet etching process, such as the RCA clean wet cleaning process, the megasonic cleaning process, or similar methods known in the industry. After polycrystalline layer 125 is removed, TiN layer 115 above the nFET region of semiconductor substrate 105 is removed. TiN layer 115 can be removed using a similar process as the removal of polycrystalline layer 125. Following the removal of TiN layer 115, high-k dielectric layer 120 becomes the top layer above the nFET region of semiconductor substrate 105. Protective gate material 145 remains disposed on STI 110.

Referring to FIG. 12, semiconductor device 100 is depicted after step S120 is completed. In step S120, metal layer 150 is deposited on top of the high-k dielectric layer 120 and protective gate material 145. The underside of metal layer 150 contacts the top side of high-k dielectric layer 120 covering above both the nFET and pFET regions of semiconductor substrate 105 and protective gate material 145. Metal layer 150 can be deposited by physical vapor deposition, chemical vapor deposition, or any other standard industry process. Metal layer 150 can be made of tantalum carbide (TaC), tantalum nitride (TaN), or other metals known in the art. Metal layer 150 can have a thickness of 1 to 5 nm. After metal layer 150 is deposited, semiconductor device 100 is patterned.

Following the completion of step S120, the resulting semiconductor device includes semiconductor substrate 105 having an nFET and pFET region, STI 110 formed in semiconductor substrate 105, high-k dielectric layer 120 deposited on semiconductor substrate 105 and a portion of STI 110, protective gate material 145 deposited on a portion of STI 110, and metal layer 150 deposited on high-k dielectric layer 120 and protective layer 145. High-k dielectric layer 120 that is deposited above the pFET region of semiconductor substrate 105 has been treated with a work function tuning process.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a semiconductor substrate, wherein a shallow trench isolation is formed in the semiconductor substrate and has a first, second, and third portion, the semiconductor substrate includes a nFET region and a pFET region;
   a protective layer disposed on the second portion of the shallow trench isolation;
   a high-k dielectric layer disposed on the semiconductor substrate, wherein the high-k dielectric layer is disposed on the nFET and pFET regions of the semiconductor substrate and disposed on the first and third portions of the shallow trench isolation; and
   a metal layer disposed on the high-k dielectric layer and the protective layer,
   wherein the high-k dielectric layer disposed above the pFET region and the third portion of the shallow trench isolation is treated with a work function tuning process.

2. The device according to claim 1, wherein the protective layer comprises silicon nitride.

3. The device according to claim 1, wherein the work function tuning process comprises an $O_2$ work function process.

4. The device according to claim 1, wherein the shallow trench isolation region includes an insulator material.

5. The device according to claim 1, wherein the shallow trench isolation region includes an oxide material.

6. The device according to claim 1, wherein the high-k dielectric layer is arranged on a channel region of the device.

7. The device according to claim 1, wherein the metal layer is disposed in contact with the high-k dielectric layer.

8. The device according to claim 1, wherein the semiconductor substrate includes silicon.

9. The device according to claim 1, wherein the protective layer includes a nitride material.

10. The device according to claim 1, wherein the shallow trench isolation includes an insulator material arranged in a trench.

11. The device according to claim 7, wherein the metal layer is formed directly on the high-k layer.

12. The device of claim 1, wherein the metal layer includes a work function metal.

13. A semiconductor device comprising:
    a semiconductor substrate, wherein a shallow trench isolation is formed in the semiconductor substrate and has a first, second, and third portion, the semiconductor substrate includes a nFET region and a pFET region;
    a protective layer disposed on the second portion of the shallow trench isolation;
    a high-k dielectric layer disposed on the semiconductor substrate, wherein the high-k dielectric layer is disposed on the nFET and pFET regions of the semiconductor substrate and disposed on the first and third portions of the shallow trench isolation; and
    a metal layer disposed on the high-k dielectric layer and the protective layer,
    wherein the high-k dielectric layer disposed above the pFET region and the third portion of the shallow trench isolation is treated with a work function tuning process that comprises an $O_2$ work function process.

14. The device according to claim 13, wherein the protective layer comprises silicon nitride.

* * * * *